United States Patent
Grimone, III

(10) Patent No.: US 7,119,601 B2
(45) Date of Patent: Oct. 10, 2006

(54) BACKGATE PULL-UP FOR PMOS PASS-GATES

(75) Inventor: Leo J. Grimone, III, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 10/911,023

(22) Filed: Aug. 4, 2004

(65) Prior Publication Data

US 2006/0028262 A1  Feb. 9, 2006

(51) Int. Cl.
*H03K 17/62* (2006.01)
(52) U.S. Cl. ...................... 327/404; 327/537
(58) Field of Classification Search ........ 327/403–404; 326/113; 361/91.1, 91.5
See application file for complete search history.

(56) References Cited

U.S. PATENT DOCUMENTS

| | | | | | |
|---|---|---|---|---|---|
| 5,880,620 | A | * | 3/1999 | Gitlin et al. ................ | 327/534 |
| 5,963,080 | A | * | 10/1999 | Miske et al. ................ | 327/534 |
| 6,100,719 | A | * | 8/2000 | Graves et al. ............... | 326/86 |
| 6,633,470 | B1 | * | 10/2003 | Ponton et al. ............. | 361/91.1 |
| 6,670,829 | B1 | * | 12/2003 | Chow .......................... | 326/83 |
| 2002/0075617 | A1 | * | 6/2002 | Ponton et al. ............. | 361/91.1 |

* cited by examiner

*Primary Examiner*—Long Nguyen
(74) *Attorney, Agent, or Firm*—Alan K. Stewart; W. James Brady; Frederick J. Telecky, Jr.

(57) ABSTRACT

The pass-gate circuit with backgate pull-up includes: a pass-gate transistor coupled between a first port and a second port; a backgate pull-up transistor coupled between a back gate of the pass-gate transistor and a gate of the pass-gate transistor; a first MOS transistor coupled between a first port and the gate of the pass-gate transistor; and a second MOS transistor coupled between a second port and the gate of the pass-gate transistor.

13 Claims, 3 Drawing Sheets

US 7,119,601 B2

BACKGATE PULL-UP FOR PMOS PASS-GATES

FIELD OF THE INVENTION

The present invention relates to electronic circuitry and, in particular, to a backgate pull-up for PMOS pass-gates.

BACKGROUND OF THE INVENTION

A back-gate pull-up is used to reduce switch off current and powered down leakage current (Ioff) in solid state switches. In switches where power down leakage is a concern, the path from the PMOS back-gate to supply voltage needs to be blocked. Placing a diode between the back-gate and supply meets the need, but allows the back-gate voltage to drift due to substrate leakages. Lower back-gate voltages will reduce the potential between the back-gate and the drain and source of the transistor. This lower potential results in higher leakage.

SUMMARY OF THE INVENTION

A pass-gate circuit with backgate pull-up includes: a pass-gate transistor coupled between a first port and a second port; a backgate pull-up transistor coupled between a back gate of the pass-gate transistor and a gate of the pass-gate transistor; a first MOS transistor coupled between a first port and the gate of the pass-gate transistor; and a second MOS transistor coupled between a second port and the gate of the pass-gate transistor.

DETAILED DESCRIPTION OF PREFERRED EMBODIMENTS

Figure 1:
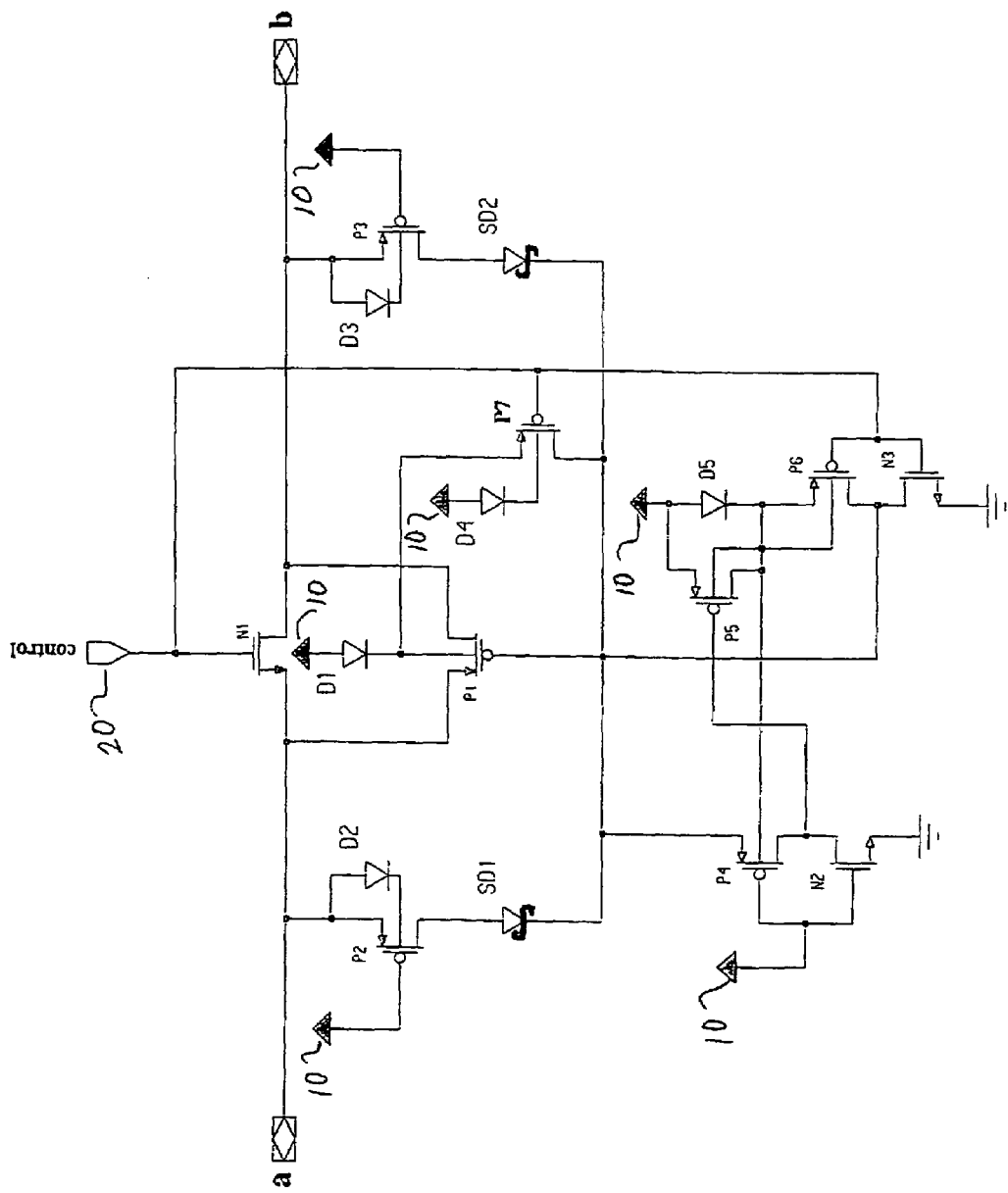
FIG. 1 is a circuit diagram of a preferred embodiment pass-gate switch circuit with backgate pull-up according to the present invention.

Supplying the largest voltage possible to the PMOS back-gate will increase the potential from back-gate to source and drain and reduce the leakage of the PMOS transistor. FIG. 1 shows a preferred embodiment bus switch with Ioff control. The circuit of FIG. 1 includes PMOS transistors P1, P2, P3, P4, P5, P6, and P7; NMOS transistors N1, N2, and N3; diodes D1, D2, D3, D4, D5; Schottky diodes SD1 and SD2; ports A and B; source voltage node 10; and switch control node 20. Transistor P7 is the back-gate pull-up. Transistors N1 and P1 form a switch between ports A and B. This switch is controlled by node 20. Node 20 is coupled directly to the gate of transistor N1, and is coupled to the gate of transistor P1 through an inverter formed by transistors P6 and N3. When transistors N1 and P1 are non-conducting, transistor P7 conducts and connects the gate and back-gate of transistor P1 together. This allows the back-gate to be held at the highest potential, through the conducting transistors P5 and P6.

During power down situations, again transistor P7 connects the gate and back-gate of transistor P1 together and to the highest potential from external sources that may be connected to port A or port B. The gate and back-gate node voltage will follow the higher of the two sources connected to port A and port B through transistor P2 and diode SD1 or transistor P3 and diode SD2, respectively.

When transistors N1 and P1 are conducting during normal operation, transistor P7 is non-conducting and is a non factor.

Figure 2:
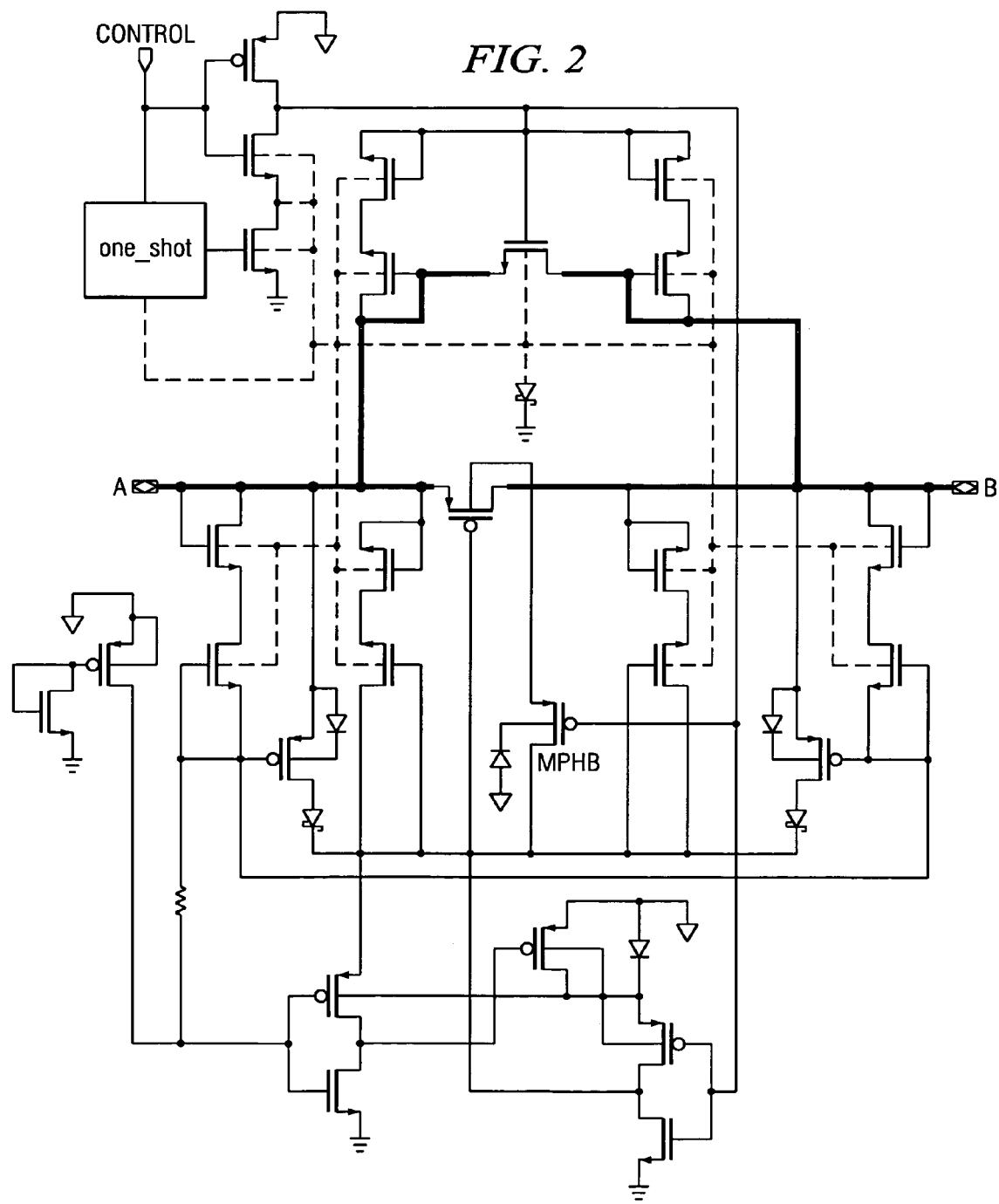
FIGS. 2 and 3 are circuit diagrams of more complex switch designs using the backgate pull-up according to the present invention.
Figure 3:
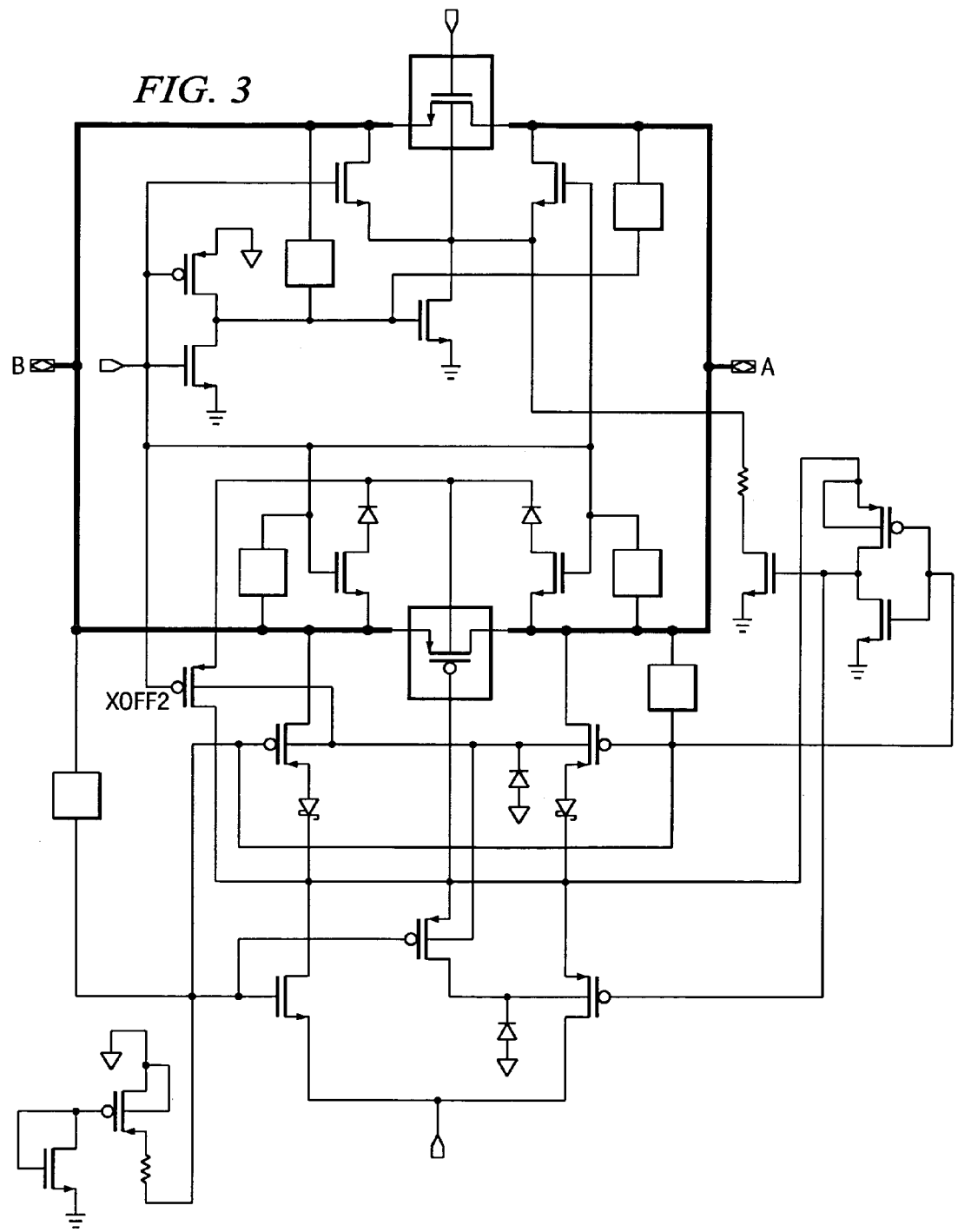

FIGS. 2 and 3 show more complex switch designs using the same concept. Transistor MPHB is the pull-up transistor in FIG. 2, while Transistor XOFF2 is the pull-up transistor in FIG. 3.

The present invention not only produces a high potential at the back-gate of the PMOS transistor during power down situations, but it maintains it during normal operation. This eliminates a possible drift in voltages that can create additional leakage conditions. The present invention is small, simple, straight forward, and eliminates the variance in the back-gate voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a first transistor coupled between a first port and a second port;
    a second transistor coupled in parallel with the first transistor, wherein the first and second transistor form a switch;
    a third transistor coupled between a back gate of the second transistor and a gate of the second transistor, wherein the third transistor is turned on when the first and second transistors are turned off;
    a fourth transistor coupled between the first port and the gate of the second transistor;
    a fifth transistor coupled between the second port and the gate of the second transistor;
    a first schottky diode coupled between the fourth transistor and the gate of the second transistor; and
    a second schottky diode coupled between the fifth transistor and the gate of the second transistor.

2. The circuit of claim 1 wherein the first transistor is an NMOS transistor and the second transistor is a PMOS transistor.

3. The circuit of claim 2 wherein a gate of the first transistor is coupled to a control node, and the gate of the second transistor is coupled to the gate of the first transistor through an inverter.

4. The circuit of claim 3 wherein the third transistor is a PMOS transistor.

5. The circuit of claim 4 wherein a gate of the third transistor is coupled to the control node.

6. The circuit of claim 1 further comprising a diode coupled between the back gate of the second transistor and a source voltage node.

7. A pass-gate circuit with backgate pull-up comprising:
    a pass-gate transistor coupled between a first port and a second port;
    a backgate pull-up transistor coupled between a back gate of the pass-gate transistor and a gate of the pass-gate transistor;

a first MOS transistor coupled between the first port and the gate of the pass-gate transistor;

a second MOS transistor coupled between the second port and the gate of the pass-gate transistor;

a first schottky diode coupled between the first MOS transistor and the gate of the pass-gate transistor; and a second schottky diode coupled between the second MOS transistor and the gate of the pass-gate transistor.

8. The circuit of claim 7 wherein the pass-gate transistor is a PMOS transistor.

9. The circuit of claim 8 further comprising an NMOS transistor coupled in parallel with the pass-gate transistor, wherein the NMOS transistor and the pass-gate transistor form a pass-gate switch.

10. The circuit of claim 9 wherein a gate of the NMOS transistor is coupled to a control node, and the gate of the pass-gate transistor is coupled to the gate of the NMOS transistor through an inverter.

11. The circuit of claim 10 wherein the backgate pull-up transistor is a PMOS transistor.

12. The circuit of claim 11 wherein a gate of the backgate pull-up transistor is coupled to the control node.

13. The circuit of claim 7 further comprising a diode coupled between the back gate of the pass-gate transistor and a source voltage node.

* * * * *